(12) United States Patent
Shih

(10) Patent No.: US 8,722,488 B2
(45) Date of Patent: May 13, 2014

(54) METHOD OF FABRICATING SEMICONDUCTOR DEVICE

(75) Inventor: Ping-Chia Shih, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/451,565

(22) Filed: Apr. 20, 2012

(65) Prior Publication Data

US 2013/0280874 A1    Oct. 24, 2013

(51) Int. Cl.
*H01L 21/336* (2006.01)

(52) U.S. Cl.
USPC ..... 438/257; 438/258; 438/266; 257/E21.421

(58) Field of Classification Search
USPC .......................... 438/257, 258, 261, 266, 267; 257/E21.422, E21.64, E21.421
See application file for complete search history.

(56) References Cited

U.S. PATENT DOCUMENTS

| | | | |
|---|---|---|---|
| 5,856,223 A * | 1/1999 | Wang | 438/264 |
| 6,821,849 B2 * | 11/2004 | Chang et al. | 438/266 |
| 7,518,912 B2 * | 4/2009 | Hung et al. | 365/185.03 |
| 7,611,941 B1 | 11/2009 | Shum | |
| 7,709,315 B2 * | 5/2010 | Tega et al. | 438/201 |
| 2005/0012135 A1 * | 1/2005 | Hsieh | 257/314 |
| 2005/0145920 A1 * | 7/2005 | Chang et al. | 257/315 |
| 2007/0202649 A1 * | 8/2007 | Yokoi | 438/270 |
| 2009/0124097 A1 * | 5/2009 | Cheng | 438/792 |
| 2012/0252221 A1 * | 10/2012 | De Brabander et al. | 438/736 |

* cited by examiner

*Primary Examiner* — Tuan N. Quach
(74) *Attorney, Agent, or Firm* — Wintson Hsu; Scott Margo

(57) ABSTRACT

A method of fabricating a semiconductor device includes the following steps. At first, two gate stack layers are formed on a semiconductor substrate, and a material layer covering the gate stack layers is formed on the semiconductor substrate. Subsequently, a part of the material layer is removed to form a sacrificial layer between the gate stack layers, and a spacer at the opposite lateral sides of the gate stack layers. Furthermore, a patterned mask covering the gate stack layers and the spacer and exposing the sacrificial layer is formed, and the sacrificial layer is removed.

15 Claims, 4 Drawing Sheets

METHOD OF FABRICATING SEMICONDUCTOR DEVICE

BACKGROUND OF THE INVENTION

1. Field of the Invention

The present invention relates to a method of fabricating the semiconductor device, and more particularly, to a method of fabricating a semiconductor device having three gates.

2. Description of the Prior Art

A flash memory is a non-volatile memory, which can preserve data within the memory even when an external power supply is off. Recently, because a flash memory is re-writable and re-erasable, it has been widely applied in the fabrication of electrical products, such as mobile phones, digital cameras, video players, personal digital assistants (PDA) or systems on a chip (SOC).

Please refer to FIG. 1, which is a cross sectional diagram illustrating a conventional flash memory cell. As shown in FIG. 1, the flash memory cell 10 includes a semiconductor substrate 12, a gate stack 14 disposed on the semiconductor substrate 12, and a select gate 20 disposed at a side of the gate stack 14. The gate stack 14 includes a floating gate 16 and a control gate 18. The floating gate 16, the control gate 18 and the select gate 20 are commonly made of polysilicon, and the dielectric layers 22/24/26 such as oxide layers are disposed between the gates for electric insulation. The flash memory cell 10 further includes a source region 28 and a drain region 30 disposed in the semiconductor substrate 12 at two sides of the gate stack 14, and a channel region 32 defined in the semiconductor substrate 12 between the source region 28 and the drain region 30. Furthermore, the dielectric layers 22 between the floating gate 16 and the semiconductor substrate 12 may serve as a tunneling oxide, and the hot electrons through the dielectric layers 22 get in or out of the floating gate 16, thereby achieving data accessing.

In the manufacturing process of the conventional flash memory cell 10, two spacer-shaped gate layers (not shown) are previously formed on both sides of the gate stack 14. Subsequently, a mask is used to cover one side of the gate stack, the select gate 20 above the drain region 30 for example, and a reactive-ion-etching (RIE) process is performed to remove the other side of the gate stack 14, the gate layer above the source region 28 for example, to complete the formation of structure of the flash memory cell 10. However, as the size of the flash memory cell 10 is reduced, after the reactive-ion-etching process is completed, some polysilicon residue may remain at the side of the gate stack 14, which is called stringer and referred as stringer R at the side S of the gate stack 14 above the source region 28 as shown in FIG. 1. The stringer R may adversely affect the electrical performances of the flash memory cell, provoke current leakage, and deteriorate the capability of preserving data of the flash memory cell. Consequently, how to avoid the formation of stringer is still an important issue in the field, in order to improve the performances of the flash memory cell.

SUMMARY OF THE INVENTION

An objective of the present invention is therefore to provide a method for fabricating a semiconductor device having three gates in order to avoid the formation of stringer.

According to one exemplary embodiment of the present invention, a method of fabricating a semiconductor device includes the following steps. At first, two gate stack layers are formed on a semiconductor substrate, then a material layer is formed on the semiconductor substrate, and the material layer covers the gate stack layers. Subsequently, a part of the material layer is removed to form a sacrificial layer between the gate stack layers, and a spacer at the opposite lateral sides of the gate stack layers. Furthermore, a patterned mask is formed, and the patterned mask covers the gate stack layers and the spacer and exposes the sacrificial layer. Afterwards, the sacrificial layer is removed.

In the method of fabricating the semiconductor device of the present invention, the spacer is only formed at one lateral side of each of the gate stack layers, and the sacrificial layer is formed between the two gate stack layers, so that no extra spacer is formed between the two gate stack layers. Accordingly, the additional lithography processes performed to remove the extra spacer between the two gate stack layers may be omitted, and the formation of stringer on a side of each of the gate stack layers and between the two gate stack layers due to the misalignment of the mask can be effectively avoided, which may enhance the performances of the semiconductor device.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
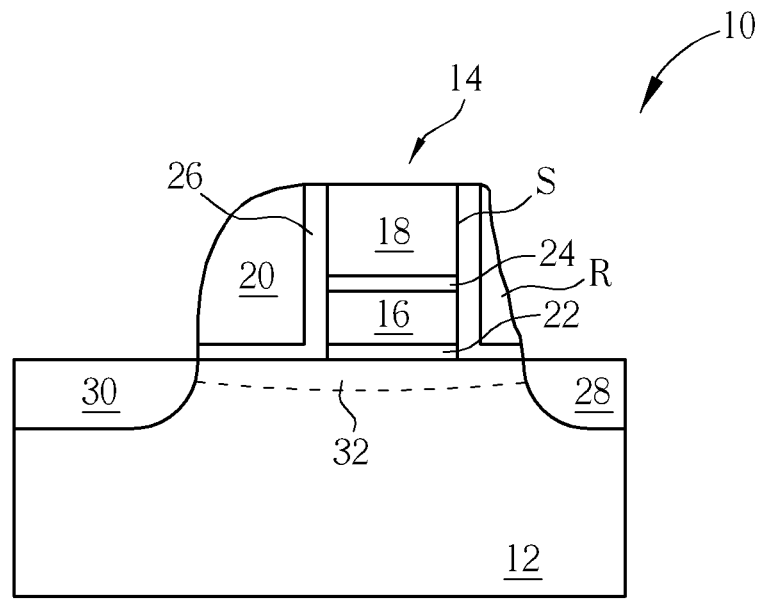
FIG. 1 is a cross sectional diagram illustrating a conventional flash memory cell.
Figure 2:
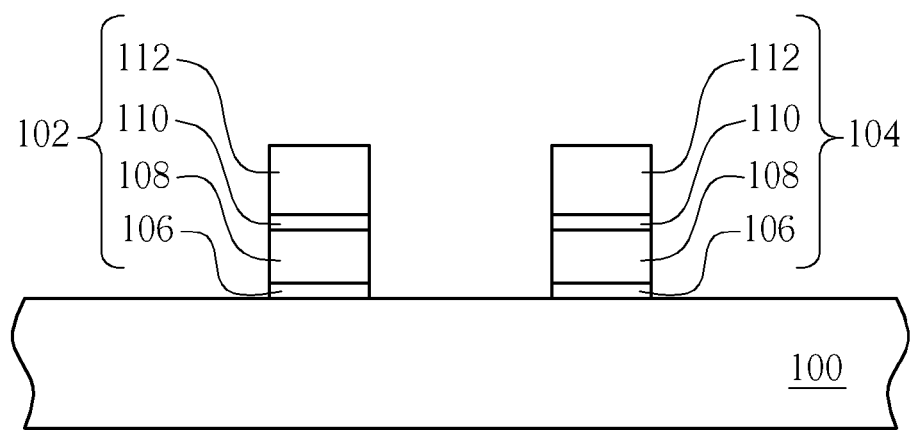
FIG. 2 through FIG. 7 are schematic diagrams illustrating a method of fabricating a semiconductor device according to a preferred exemplary embodiment of the present invention.

The present invention provides a method of fabricating a semiconductor device. Please refer to FIG. 2 through FIG. 7, which are schematic diagrams illustrating a method of fabricating a semiconductor device according to a preferred exemplary embodiment of the present invention. As shown in FIG. 2, two gate stack layers 102/104 are formed on a semiconductor substrate 100. The semiconductor substrate 100 includes a substrate composed of Si, AsGa, silicon on insulator (SOI) layer, epitaxial layer, SiGe layer or other semiconductor materials. Each of the gate stack layers 102/104 includes at least a gate layer and at least a dielectric layer. In this exemplary embodiment, each of the gate stack layers 102/104 includes a first dielectric layer 106, a first gate layer 108, a second dielectric layer 110 and a second gate layer 112 disposed sequentially on the semiconductor substrate 100. The gate stack layers 102/104 have basically the same height and the same width, but not limited thereto.

The method of forming the two gate stack layers 102/104 includes the following steps. At first, a stack layer (not shown) including a dielectric layer, a gate layer, a dielectric layer and a gate layer disposed orderly on the semiconductor substrate 100. The dielectric layer may include a single layer structure or a multiple layers structure made of insulating materials such as silicon oxide, silicon oxynitride, or other high-k gate dielectric layers with a dielectric constant larger than 4. The gate layer may be made of conductive materials such as polysilicon, metal silicide or metal layer with specific work function. In this exemplary embodiment, the dielectric layers are made of silicon oxide formed through thermal oxidation process or deposition process such as chemical vapor deposition (CVD) process or atomic layer deposition (ALD) process; the gate layers are made of polysilicon formed through low pressure chemical vapor deposition (LPCVD) process; and the cap layer is made of silicon nitride formed through chemical vapor deposition (CVD) process, but not limited thereto. Subsequently, a patterned photoresist layer (not shown) is formed on the stack layer, and an etching process is performed to remove a part of the stack layer to form the two gate stack layers 102/104 having the same width. The etching process may include the following steps. For example: the patterned photoresist layer is used as a mask, and an anisotropic dry etching process is performed to remove a part of the dielectric layers and a part of the gate layers below the patterned photoresist layer to form the first dielectric layer 106, the first gate layer 108, the second dielectric layer 110 and the second gate layer 112 disposed sequentially on the semiconductor substrate 100. In this exemplary embodiment, the first dielectric layer 106 may serve as a tunneling oxide, the first gate layer 108 may serve as a floating gate, the second dielectric layer 110 may serve as a dielectric layer between gates, and the second gate layer 112 may serve as a control gate. In addition the first gate layer 108 as floating gate could also include material such as silicon nitride in order to trap charges. Then, the patterned photoresist layer is removed.

Figure 3:
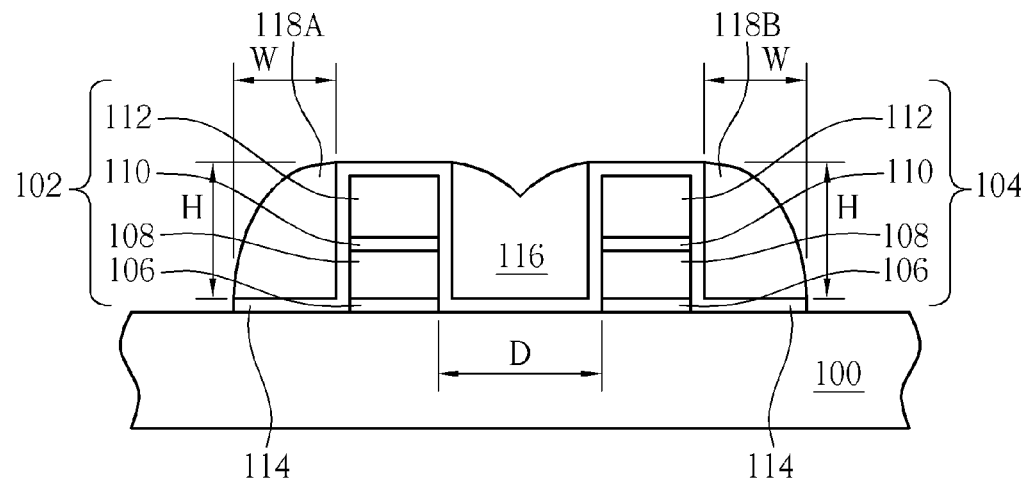

As shown in FIG. 3, a dielectric layer 114 is conformally formed on the semiconductor substrate 100. The dielectric layer 114 may include a single layer structure or a multi-layered structure made of insulating materials such as silicon oxide, silicon oxynitride, or other high-k gate dielectric layers with a dielectric constant larger than 4. The dielectric layer 114 on the gate stack layers 102/104 may cover the top of each of the gate stack layers 102/104 and the sidewalls of each of the gate stack layers 102/104. The method of forming the dielectric layer 114 may include performing a thermal oxidation process to oxidize the exposed surfaces of the gate stack layers 102/104 and the exposed semiconductor substrate 100, or performing a chemical vapor deposition process to form the dielectric layer 114 made of silicon oxide.

Subsequently, a material layer (not shown) is conformally formed on the dielectric layer 114. The material layer could be made of conductive material such as polysilicon, metal silicide or metal layer with specific work function, and is used to form a third gate layer which serves as select gate in the following processes, but not limited thereto. In other exemplary embodiments, the material layer may be made of insulating material to be applied in the other kinds of semiconductor processes. In this exemplary embodiment, the material layer is made of polysilicon through chemical vapor deposition process.

Furthermore, a part of the material layer is removed to expose a part of the dielectric layer 114, and the exposed dielectric layer 114 is on the top of each of the gate stack layers 102/104. The method of removing a part of the material layer includes performing an anisotropic etching process such as reactive-ion-etching (RIE) process. The remaining material layer includes a sacrificial layer 116 formed between the gate stack layers 102/104, and a self-aligned spacer 118A/118B formed at the opposite lateral sides of the gate stack layers 102/104. The spacer 118A at the side of the gate stack layer 102 and the spacer 118B at the side of the gate stack layer 104 have the same height H and the same width W. Additionally, the arc surface of the spacer 118A and the arc surface of the spacer 118B have opposite protruding directions.

The fabricating process disclosed in the present invention could be integrated into all kinds of the manufacturing process of semiconductor devices. The flash memory cell is taken as an example. Since the material layer is made of polysilicon, the spacer 118A/118B could serve as the third gate layer, i.e. the select gate, and is disposed at a side of each of the gate stack layers 102/104. The dielectric layer 114 between the spacer 118A and the gate stack layer 102 and between the spacer 118B and the gate stack layer 104 could be a dielectric layer between gate layers. Accordingly, the third gate layer including the spacer 118A/118B, the first gate layer 108 and the second gate layer 112 may be electrically insulated from each other. Furthermore, the interval D between the gate stack layers 102/104 and the process conditions of the anisotropic etching process used to remove a part of the material layer can be modified to have the remaining material layer between the gate stack layers 102/104 merged into as the sacrificial layer, without being separated as two spacers. In this exemplary embodiment, the formed sacrificial layer 116 entirely overlaps the semiconductor substrate 100 between the gate stack layers 102/104. Moreover, the interval D between the gate stack layers 102/104 may cause the top of the sacrificial layer 116 as a planar surface or a surface having a concave v-shape.

Figure 4:
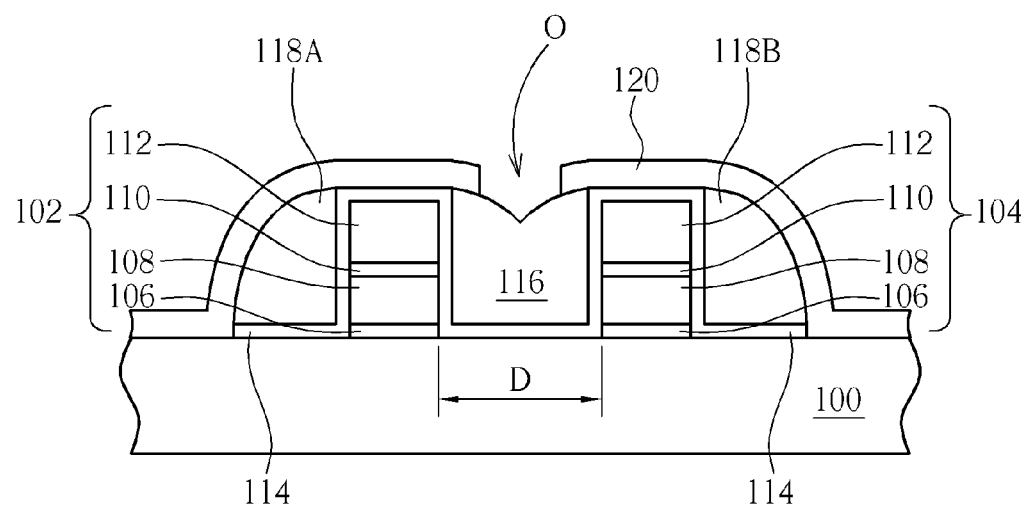

As shown in FIG. 4, a patterned mask 120 is formed, and the patterned mask 120 covers the gate stack layers 102/104 and the spacer 118A/118B, and exposes the sacrificial layer 116. An etching selectivity exists between a material of the patterned mask 120 and the material of the sacrificial layer 116/the dielectric layer 114. In other words, as an etchant is used in the etching process, an etching rate of the patterned mask 120 is preferably different from an etching rate of the sacrificial layer 116/the dielectric layer 114. For example, a patterned photoresist layer could be directly used as the patterned mask 120 to cover the gate stack layers 102/104 and the spacer 118A/118B, and expose the sacrificial layer 116. In this exemplary embodiment, the material of the patterned mask 120 is selected as silicon nitride for its proper etching selectivity and its high capability of being integrated into processes of manufacturing other semiconductor elements. The method of forming the patterned mask 120 includes the following steps. A mask layer (not shown) made of silicon nitride is conformally formed on the semiconductor substrate 100, and the mask layer covers the semiconductor substrate 100, the gate stack layers 102/104 and the spacer 118A/118B. A patterned photoresist layer (not shown) is formed on the mask layer, an etching process with the patterned photoresist layer as a mask is further performed to remove a part of the mask layer to form an opening O in the mask layer, and the opening O is used to expose the sacrificial layer 116. Subsequently, the patterned photoresist layer is removed, and the patterned mask 120 is formed. It as appreciated that, a width of the opening O is preferably substantially smaller than the interval D between the gate stack layers 102/104 for better protection of the formed gate stack layers 102/104 and the formed spacer 118A/118B. In other words, the patterned mask 120 preferably partially covers the sacrificial layer 116, and the opening O of the patterned mask 120 exposes a part of the sacrificial layer 116.

Figure 5:
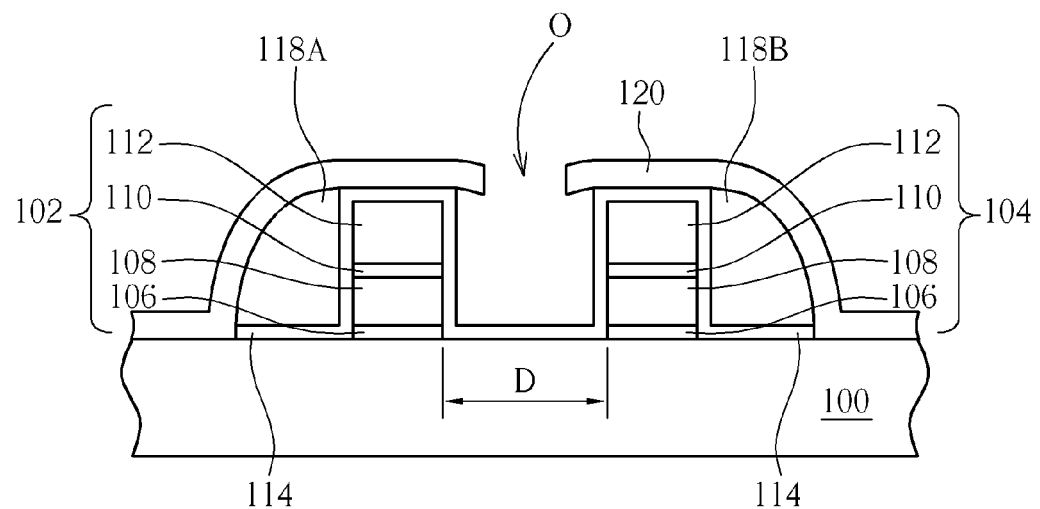

As shown in FIG. 5, an etching process is performed to remove the sacrificial layer 116 between the gate stack layers 102/104. In this exemplary embodiment, a wet etching process is performed to remove the sacrificial layer 116, and the etchant has selectivity to silicon oxide and silicon nitride. More specifically, as the etching process is performed to remove the sacrificial layer 116, the patterned mask 120 may be used as a mask, a part of the dielectric layer 114, i.e. the dielectric layer 114 between the gate stack layers 102/104 and the sacrificial layer 116 and between the semiconductor substrate 100 and the sacrificial layer 116, may be used as an etching stop layer for prevent the gate stack layers 102/104, the spacer 118A/118B and the semiconductor substrate 100 from being damaged by the etchant during the etching process.

Figure 6:
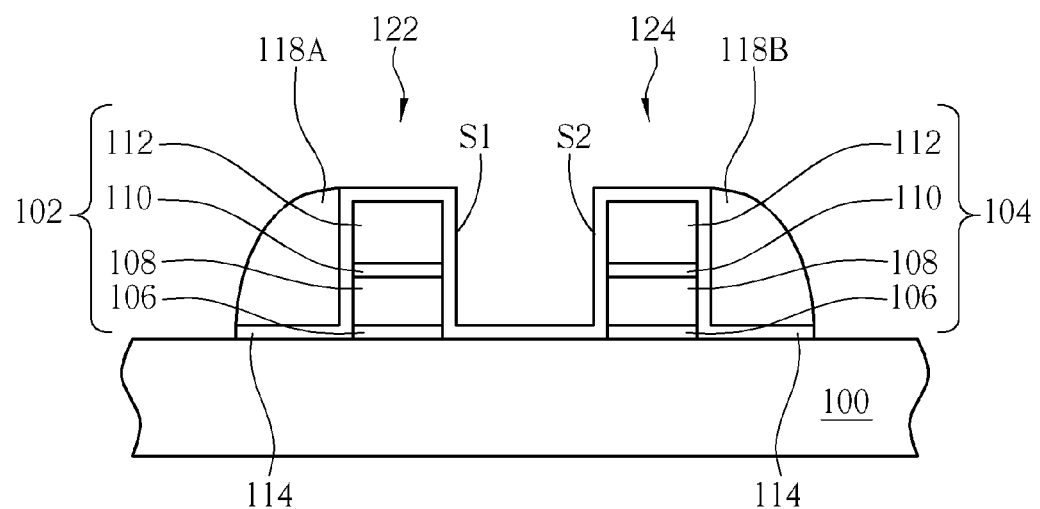

As shown in FIG. 6, an etching process is performed to remove the patterned mask 120 to respectively form a first gate structure 122 and a second gate structure 124, and the first gate structure 122 is a symmetric reflection of the second gate structure 124. In this exemplary embodiment, a wet etching process is performed, and the etchant is selected as heated phosphoric acid solution to remove the patterned mask 120 made of silicon nitride. Furthermore, each of the first gate structure 122 and the second gate structure 124 includes three gates, i.e. the first gate layer 108, the second gate layer 112, and the spacer 118A/118B (the third gate layer). The sacrificial layer 116 between the gate stack layers 102/104 is removed, and the spacer 118A/118B is only formed at the opposite lateral sides of the gate stack layers 102/104. In other words, the spacer 118A is only formed at the left lateral side of the gate stack layers 102 and the spacer 118B is only formed at the right lateral side of the gate stack layers 104. Accordingly, the etching process for removing the additional conductive materials, such as conductive spacer between the first gate structure 122 and the second gate structure 124, can be omitted, and the formation of stringer made of conductive material on the sides S1/S2 between the first gate structure 122 and the second gate structure 124 due to the misalignment of mask may be avoided, which may further improve the performances and the yield of the semiconductor device.

Figure 7:
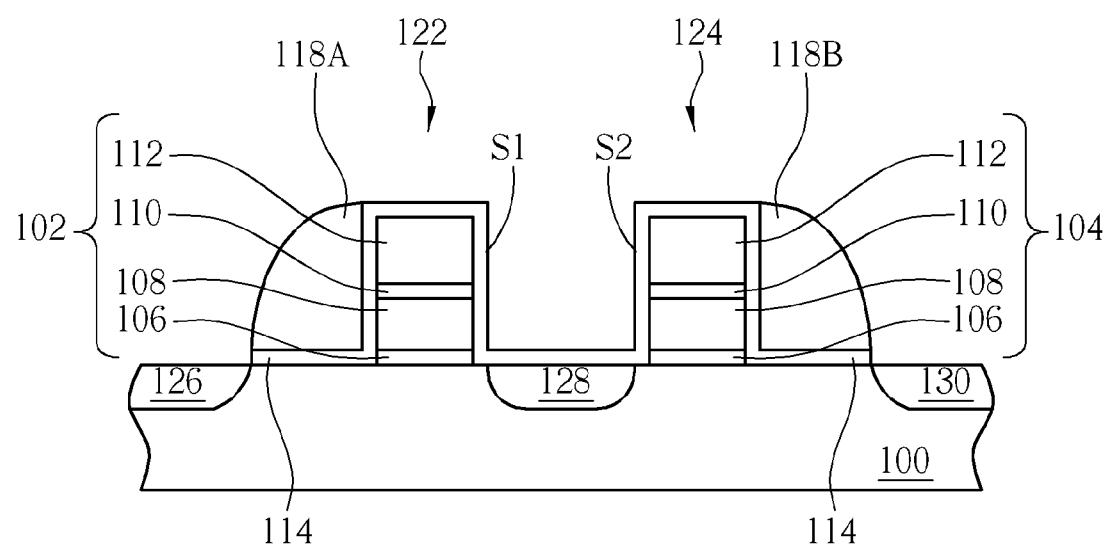

As shown in FIG. 7, an ion implantation process is performed, and the first gate structure 122 and the second gate structure 124 are used as a mask. Accordingly, the source/drain regions 126/128/130 are respectively formed in the semiconductor substrate 100 at two sides of each of the first gate structure 122 and the second gate structure 124. In this exemplary embodiment, the source/drain region 128 can serve as the common source region of the first gate structure 122 and the second gate structure 124, which may reduce the occupied area of the semiconductor device, and increase the integration rate of semiconductor devices.

In conclusion, in the method of fabricating the semiconductor device of the present invention, the spacer is only formed at one lateral side of each of the gate stack layers, and the sacrificial layer is formed between the two gate stack layers, so that no extra spacer would be formed between the two gate stack layers. Accordingly, the additional lithography processes performed to remove the extra spacer between the two gate stack layers may be omitted, and the formation of stringer on a side of each of the gate stack layers and between the two gate stack layers due to the misalignment of the mask can be effectively avoided, which may enhance the performances of the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device, comprising:
    forming two gate stack layers on a semiconductor substrate, wherein each of the gate stack layers comprises at least two gate layers;
    forming a single dielectric layer completely covering and contacting the gate stack layers;
    forming a material layer covering the gate stack layers and the dielectric layer on the semiconductor substrate;
    removing a part of the material layer to form an isolated spacer having an arc surface at the opposite lateral sides of the gate stack layers, and a remaining material layer between the gate stack layers being merged into as a sacrificial layer;
    conformally forming a patterned mask totally covering the gate stack layers and the spacer and exposing the sacrificial layer, wherein a top of the patterned mask is non-planar; and
    removing the sacrificial layer.

2. The method of fabricating a semiconductor device according to claim 1, further comprising:
    removing the patterned mask to respectively form a first gate structure and a second gate structure, wherein the first gate structure is a symmetric reflection of the second gate structure.

3. The method of fabricating a semiconductor device according to claim 2, further comprising:
    performing an ion implantation process for respectively forming a source/drain region in the semiconductor substrate at two sides of each of the first gate structure and the second gate structure.

4. The method of fabricating a semiconductor device according to claim 1, wherein each of the gate stack layers comprises at least a gate layer and at least a dielectric layer.

5. The method of fabricating a semiconductor device according to claim 4, wherein a material of the gate layer comprises conductive material.

6. The method of fabricating a semiconductor device according to claim 5, wherein a material of the gate layer comprises polysilicon.

7. The method of fabricating a semiconductor device according to claim 1, wherein a material of the material layer comprises conductive material.

8. The method of fabricating a semiconductor device according to claim 1, wherein removing a part of the material layer comprises performing an anisotropic etching process.

9. The method of fabricating a semiconductor device according to claim 1, wherein after removing a part of the material layer, the formed sacrificial layer entirely overlaps the semiconductor substrate between the gate stack layers.

10. The method of fabricating a semiconductor device according to claim 1, wherein after removing a part of the material layer, the exposed dielectric layer is on a top of each of the gate stack layers.

11. The method of fabricating a semiconductor device according to claim 1, wherein the patterned mask partially covers the sacrificial layer.

12. The method of fabricating a semiconductor device according to claim 1, wherein the method for forming the patterned mask, comprises:
    forming a mask layer on the semiconductor substrate;
    forming a patterned photoresist layer on the mask layer;
    removing a part of the mask layer for forming an opening in the mask layer, wherein the opening is used to expose the sacrificial layer; and
    removing the patterned photoresist layer.

13. The method of fabricating a semiconductor device according to claim 12, wherein a width of the opening is substantially smaller than an interval between the gate stack layers.

14. The method of fabricating a semiconductor device according to claim 1, wherein a material of the patterned mask comprises silicon nitride.

15. The method of fabricating a semiconductor device according to claim 1, wherein removing the sacrificial layer comprises performing a wet etching process.

\* \* \* \* \*